(12) United States Patent
Darzy

(10) Patent No.: US 11,863,199 B2
(45) Date of Patent: Jan. 2, 2024

(54) DIFFERENTIAL CIRCUITRY

(71) Applicant: Socionext Inc., Kanagawa (JP)

(72) Inventor: Saul Darzy, Maidenhead (GB)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/959,887

(22) Filed: Oct. 4, 2022

(65) Prior Publication Data

US 2023/0123260 A1    Apr. 20, 2023

(30) Foreign Application Priority Data

Oct. 20, 2021   (EP) ..................................... 21203829

(51) Int. Cl.
| | | |
|---|---|---|
| *H03M 1/78* | (2006.01) | |
| *H03M 1/74* | (2006.01) | |
| *H03M 1/06* | (2006.01) | |
| *H03M 1/66* | (2006.01) | |
| *H03K 17/60* | (2006.01) | |

(52) U.S. Cl.
CPC ........... *H03M 1/785* (2013.01); *H03M 1/747* (2013.01); *H03K 17/60* (2013.01); *H03M 1/0658* (2013.01); *H03M 1/66* (2013.01); *H03M 1/78* (2013.01)

(58) Field of Classification Search
CPC ...... H03M 1/785; H03M 1/66; H03M 1/0658; H03M 1/78; H03K 17/60
See application file for complete search history.

(56) References Cited

U.S. PATENT DOCUMENTS

| | | | |
|---|---|---|---|
| 5,781,141 A | 7/1998 | Ikuta et al. | |
| 6,593,869 B1 * | 7/2003 | Elliott | H03K 17/567 |
| | | | 341/154 |
| 2009/0128387 A1 | 5/2009 | Lu et al. | |
| 2020/0099389 A1 | 3/2020 | Sung et al. | |

FOREIGN PATENT DOCUMENTS

JP         04-217120 A       8/1992

OTHER PUBLICATIONS

Extended European Search Report dated Apr. 4, 2022 issued in the corresponding European Patent Application No. 21203829.3.
F. G. Weiss and T. G. Bowman, "A 14-bit, 1 Gs/s DAC for direct digital synthesis applications," [1991] GaAs IC Symposium Technical Digest, 1991, pp. 361-364.

* cited by examiner

*Primary Examiner* — Joseph J Lauture
(74) *Attorney, Agent, or Firm* — Rimon P.C.

(57) ABSTRACT

Differential circuitry including first and second current paths each including a succession of first and further load nodes, each successive further load node connected to its preceding load node via a divider impedance; and first switching circuitry connected to the further load node or nodes of the first current path, and second switching circuitry connected to the further load node or nodes of the second current path, the first and second switching circuitry controlling a magnitude of controllable current signals passing through the load nodes of the first current path and the second current path, respectively, wherein: the first load nodes of the first and second current paths include a first pair of load nodes, and the or each successive further load node of the first current path and its corresponding successive further load node of the second current path include a successive further pair of load nodes.

16 Claims, 12 Drawing Sheets

DIFFERENTIAL CIRCUITRY

CROSS-REFERENCE OF RELATED APPLICATIONS

This application claims the benefit of European Patent Application No. 21203829.3, filed on Oct. 20, 2021, the entire disclosure of which Application is incorporated by reference herein.

The present invention relates to differential circuitry, for example for use in a digital-to-analogue converter (DAC), and in particular to differential circuitry able to protect components from overvoltage or reduce an impact of overvoltage on such components. Such circuitry may be implemented as integrated circuitry, for example on an IC chip.

Overvoltage may cause errors in circuitry such as a DAC or may even cause circuitry to stop functioning properly or have a reduced life. With increasing speeds of such circuitry, and corresponding miniaturisation of semiconductor device sizes, there is ever increasing pressure on operating such circuitry accurately.

According to an embodiment of a first aspect of the present invention, there is provided differential circuitry comprising: first and second current paths each comprising a succession of first and further load nodes, each successive further load node connected to its preceding load node via a divider impedance; and first switching circuitry connected to the further load node or nodes of the first current path, and second switching circuitry connected to the further load node or nodes of the second current path, the first and second switching circuitry configured to change/control (based on control signals) a magnitude of controllable current signals passing through the load nodes of the first current path and the second current path, respectively, wherein: the first load nodes of the first and second current paths comprise (or constitute) a first pair of load nodes, and the or each successive further load node of the first current path and its corresponding successive further load node of the second current path comprise (or constitute) a successive further pair of load nodes; the first pair of load nodes are connected to a first common node via respective first load impedances and the or each successive further pair of load nodes are connected to a successive further common node via respective further load impedances; the or each successive further common node is connected to its preceding common node; and the or at least one of the successive further common nodes is connected to its preceding common node via a resistor (impedance having at least a resistance component).

Such circuitry can avoid problems associated with overvoltage. Such circuitry can achieve improved performance because the DC levels at the load nodes are closer to each other due to the resistor(s).

The or at least one of the successive further common nodes may be connected to its preceding common node via one or more discrete impedances as the resistor.

The or each other successive further common node may be shorted (or short-circuited) to its preceding common node.

In other words, the or each other successive further common node may not be connected via a resistor to its preceding common node, or may be connected to its preceding common node via a substantially zero resistance connection or a low or negligible impedance/resistance connection.

The differential circuitry may comprise N said successive further load nodes and N said successive further common nodes, wherein N is an integer greater than 1, wherein: for n of the successive further common node or nodes, the or each successive further common node is connected to its preceding common node via a resistor, wherein n is an integer and at least 1; and for N-n of the successive further common node or nodes, the or each successive further common node is shorted (or short-circuited) to its preceding common node.

The value n may be 1 or N, or n may be any integer value in the range $1 \leq n \leq N$.

The differential circuitry may comprise a plurality of said successive further load nodes and a plurality of said successive further common nodes, and each successive further common node may be connected to its preceding common node via a resistor.

The differential circuitry may comprise a plurality of said resistors, and the resistors interconnecting said common nodes may have the same resistance values as each other.

At least a plurality of the load impedances may have the same impedance values as each other.

The divider impedances may have the same impedance values as each other.

The divider impedances may be or may comprise discrete divider impedances/discrete divider resistors, and/or the load impedances may be or may comprise discrete load impedances/discrete load resistors.

The first load nodes may be connected to first and second output nodes, respectively.

The differential circuitry may be configured to output a differential output signal between the first and second output nodes indicative of a differential input signal.

The first switching circuitry and the second switching circuitry may be configured to change the magnitude of the controllable current signals based on control signals indicative of a/the differential input signal.

The first switching circuitry may comprise a plurality of switches connected to the load nodes of the first current path, respectively, and the second switching circuitry may comprise a plurality of switches connected to the load nodes of the second current path, respectively.

The first switching circuitry may comprise a plurality of current sources connected (between a (low) voltage reference and the switches of the first switching circuitry) to define respective currents at the switches of the first switching circuitry, respectively, and the second switching circuitry may comprise a plurality of current sources connected (between a (low) voltage reference and the switches of the second switching circuitry) to define respective currents at the switches of the second switching circuitry, respectively.

The first switching circuitry and the second switching circuitry may comprise a plurality of current sources, each current source connected (between a (low) voltage reference (wherein the low voltage references may be the same low voltage reference) and the switches connected to a said pair of loads nodes) to define respective currents at the switches connected to a said pair of load nodes.

The switches of the first switching circuitry may be connected/configured to be controlled by control signals indicative of a first input signal, and the switches of the second switching circuitry may be connected/configured to be controlled by control signals indicative of a second input signal, the first and second input signals together corresponding to a/the differential input signal.

The differential input signal may be a digital signal. The differential circuitry may be configured to output an analogue signal as the differential output signal, based on the digital signal.

According to an embodiment of a second aspect of the present invention, there is provided differential circuitry comprising: first and second current paths each comprising a succession of first and further load nodes, each successive further load node connected to its preceding load node via a divider impedance, wherein: the first load nodes of the first and second current paths comprise a first pair of load nodes, and the or each successive further load node of the first current path and its corresponding successive further load node of the second current path comprise a successive further pair of load nodes; the first pair of load nodes are connected to a first common node via respective first load impedances and the or each successive further pair of load nodes are connected to a successive further common node via respective further load impedances; the or each successive further common node is connected to its preceding common node; and the or at least one of the successive further common nodes is connected to its preceding common node via a resistor.

According to an embodiment of a third aspect of the present invention, there is provided differential circuitry comprising: first and second current paths each comprising a first load node, a second load node, and an output node, wherein the differential circuitry is configured to output a differential current signal between the output nodes; and a first switching circuit connected to the first and second load nodes of the first current path, and a second switching circuit connected to the first and second load nodes of the second current path, the first and second switching circuits configured to change (based on control signals) a magnitude of controllable current signals passing through the load nodes of the first current path and the second current path, respectively, wherein each current path comprises a first divider impedance connected between its first load node and its output node, and a second divider impedance connected between its first load node and its second load node, wherein both of the first load nodes are connected to a first common node via respective first common impedances, both of the second load nodes are connected to a second common node via respective second common impedances, and both of the output nodes are connected to a reference node via respective reference impedances, wherein the reference node is connected to a voltage reference, wherein the differential circuitry further comprises a first common impedance/resistor connected between the reference node and the first common node, and a second common impedance/resistor connected between the first and second common nodes.

According to an embodiment of a fourth aspect of the present invention, there is provided digital-to-analogue converter, DAC, circuitry comprising the differential circuitry of any of the first to third aspects.

According to an embodiment of a fifth aspect of the present invention, there is provided integrated circuitry such as an IC chip, comprising the differential circuitry of any of the first to third aspects or the DAC circuitry of the fourth aspect.

Reference will now be made, by way of example, to the accompanying drawings, of which:

Figure 1:
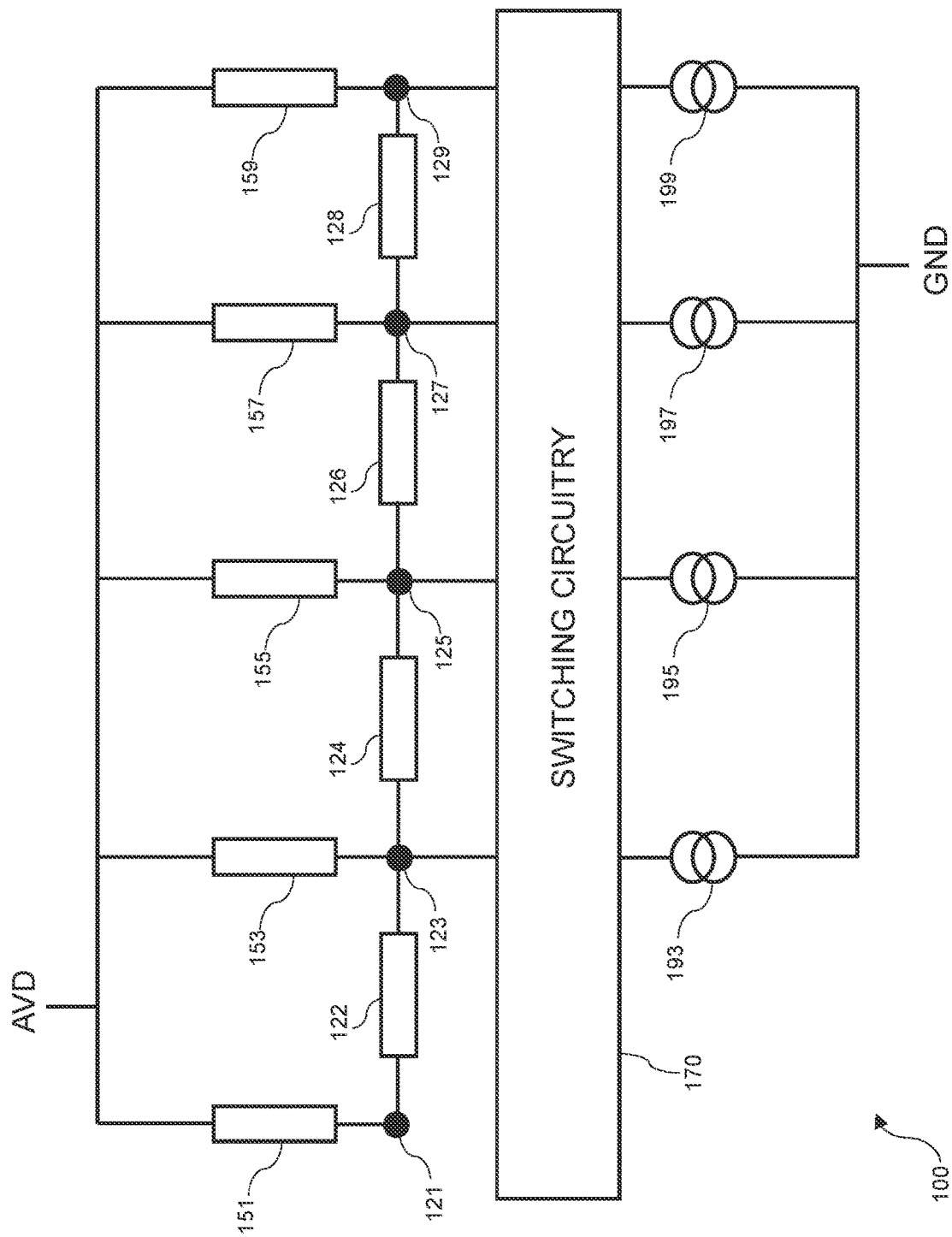
FIG. 1 is a schematic diagram of DAC circuitry as a comparative example.

FIG. 1 is a schematic diagram of DAC circuitry 100 as a comparative example. DAC circuitry 100 comprises a succession of first and further load nodes 121, 123, 125, 127, and 129, each successive further load node 123, 125, 127, and 129 connected to its preceding load node via a divider impedance 122, 124, 126, and 128 (which may be or comprise a resistor). That is, the further load node 123 is connected to its preceding load node (the first load node) 121 via the divider impedance 122, and so on and so forth.

DAC circuitry 100 further comprises a plurality of load impedances 151, 153, 155, 157, and 159 (which may be or comprise resistors) connected between a (high) voltage reference AVD and the plurality of load nodes 121, 123, 125, 127, and 129, respectively. That is, the load impedance 151 is connected between the voltage reference AVD and the load node 121, the load impedance 153 is connected between the voltage reference AVD and the load node 123, and so on and so forth.

DAC circuitry further comprises switching circuitry 170 and a plurality of current sources 193, 195, 197, and 199. The switching circuitry 170 is connected between the further load nodes 123, 125, 127, and 129 and the current sources 193, 195, 197, and 199. The current sources 193, 195, 197, and 199 are connected to a voltage reference lower than the voltage reference AVD (e.g. shown as GND).

The first load node 121 is connected to an output node (not shown). The first load node 121 may be considered to be the output node.

DAC circuitry 100 is configured to output an analogue output signal at the output node indicative of a digital input signal. This is achieved by the switching circuitry 170 which is configured to change, based on control signals (not shown), a magnitude of controllable current signals passing through the load nodes 121, 123, 125, 127, and 129. The control signals are indicative of the digital input signal. In particular, although not shown, the switching circuitry 170 comprises a plurality of switches, each switch connected between a corresponding one of the further load nodes 123, 125, 127, and 129 and a corresponding one of the current sources 193, 195, 197, and 199 (e.g. between load node 123 and current source 193). The switches correspond to different data bits of the digital input signal and the setting of the switch is by the corresponding data bit. For this reason the further load nodes 123, 125, 127, and 129 may be associated with different bits of the digital input signal and may be labelled as LSB (least significant bit) 3, LSB2, LSB1, and LSB0, respectively.

DAC circuitry 100 can be considered to be (or to comprise) an R2R network/ladder or an R2R circuit or R2R circuitry. That is, in order to effect binary weighting the impedances 122, 124, 126, 128 and 159 may have a relative resistance R and the impedances 153, 155 and 157 may have a relative resistance 2R, and this will be carried forwards as a running example.

The voltage levels at the further load nodes 123, 125, 127, and 129 (which may be referred to as ladder taps) can vary as the switches of the switching circuitry 170 turn on and off because the current through the R2R ladder varies due to contributions from different current sources 193, 195, 197, and 199 (which may be referred to as slice currents). For example, the voltage level at the further load nodes 123, 125, 127, and 129 can be higher when lower current is flowing in the R2R ladder. Furthermore, the voltage levels for the lower LSBs, e.g. LSB0, are higher than the higher LSBs, e.g. LSB3 (that is, the voltage level at e.g. the load node 129 may be higher than that at the load node 123). This voltage level (e.g. the load node 129) can be higher than the rating of the components (i.e. the switches) used in the design which can lead to overvoltage. This can cause errors in the operation of the DAC circuitry 100 or cause the DAC circuitry 100 to stop working properly or have a reduced life.

Furthermore the difference in DC level (common mode voltage) across or at the further load nodes 123, 125, 127, and 129 can degrade performance (as explained more fully below with respect to FIG. 9).

Figure 2:
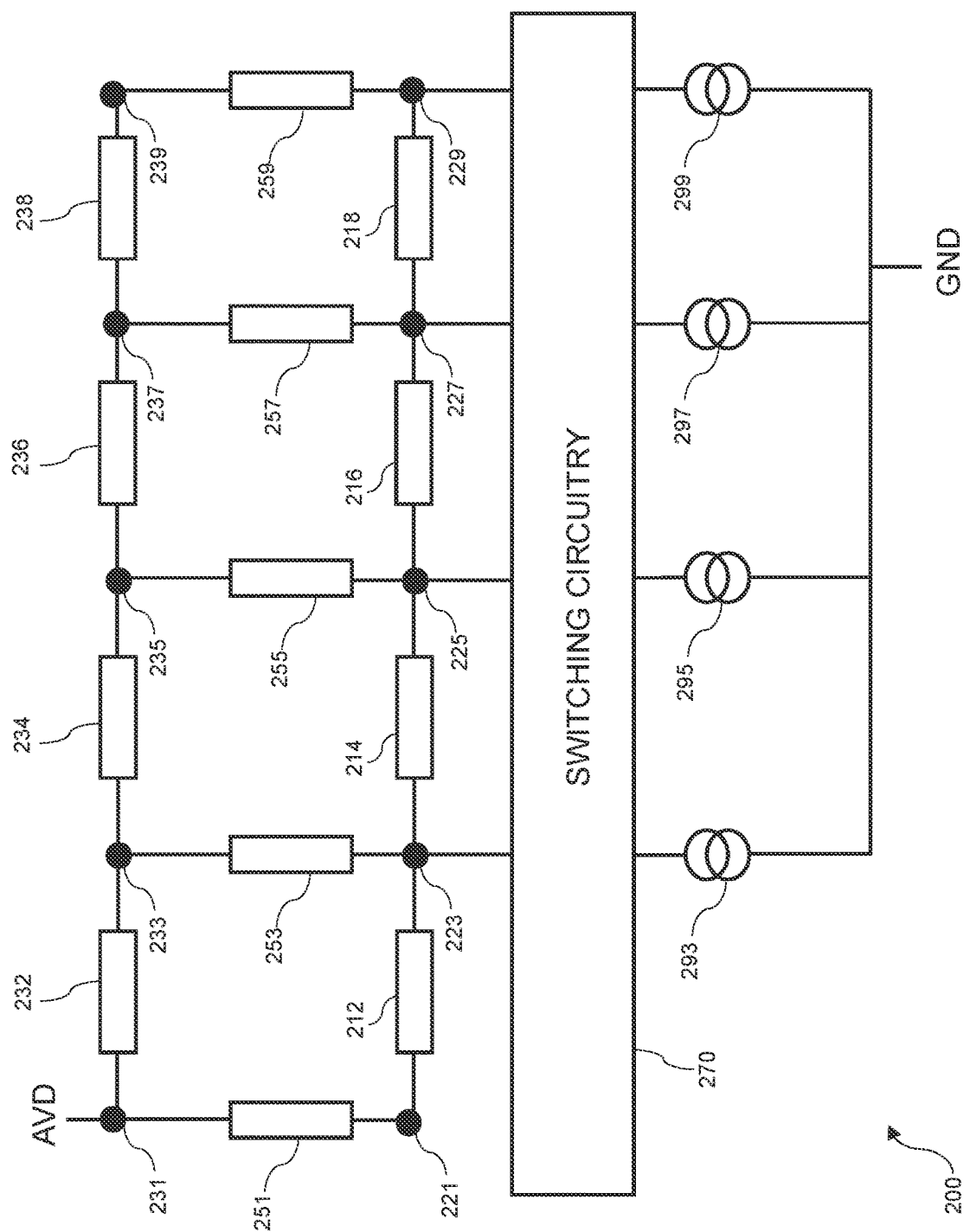
FIG. 2 is a schematic diagram of DAC circuitry as a comparative example.

FIG. 2 is a schematic diagram of DAC circuitry 200 as a comparative example.

DAC circuitry 200 is the same as DAC circuitry 100 except for the additional impedances and connections along the top of FIG. 2. Like reference numerals have been given to elements corresponding to elements in DAC circuitry 100 (with a "2" at the start instead of a "1"). The elements corresponding to elements in DAC circuitry 100 will not be described and only the differences of DAC circuitry 200 compared to DAC circuitry 100 will be described.

DAC circuitry 200 comprises a succession of first and further common nodes 231, 233, 235, 237 and 239, each successive further common node 233, 235, 237 and 239 connected to its preceding common node via a common impedance 232, 234, 236, and 238. That is, the further common node 233 is connected to its preceding common node (the first common node) 231 via the common impedance 232, and so on and so forth. The common nodes 231, 233, 235, 237 and 239 are connected to the load nodes 221, 223, 225, 227, and 229 via the load impedances 251, 253, 255, 257, and 259, respectively. The first common node 231 is connected to the high voltage reference AVD in line with FIG. 1.

The common impedances 232, 234, 236, and 238 (which may be or comprise resistors) cause a voltage drop to prevent overvoltage. However the common impedances 232, 234, 236, and 238 impact the binary ratio of the R2R ladder in the running example and as such the DAC circuitry 200 does not properly function as an R2R ladder.

Figure 3:
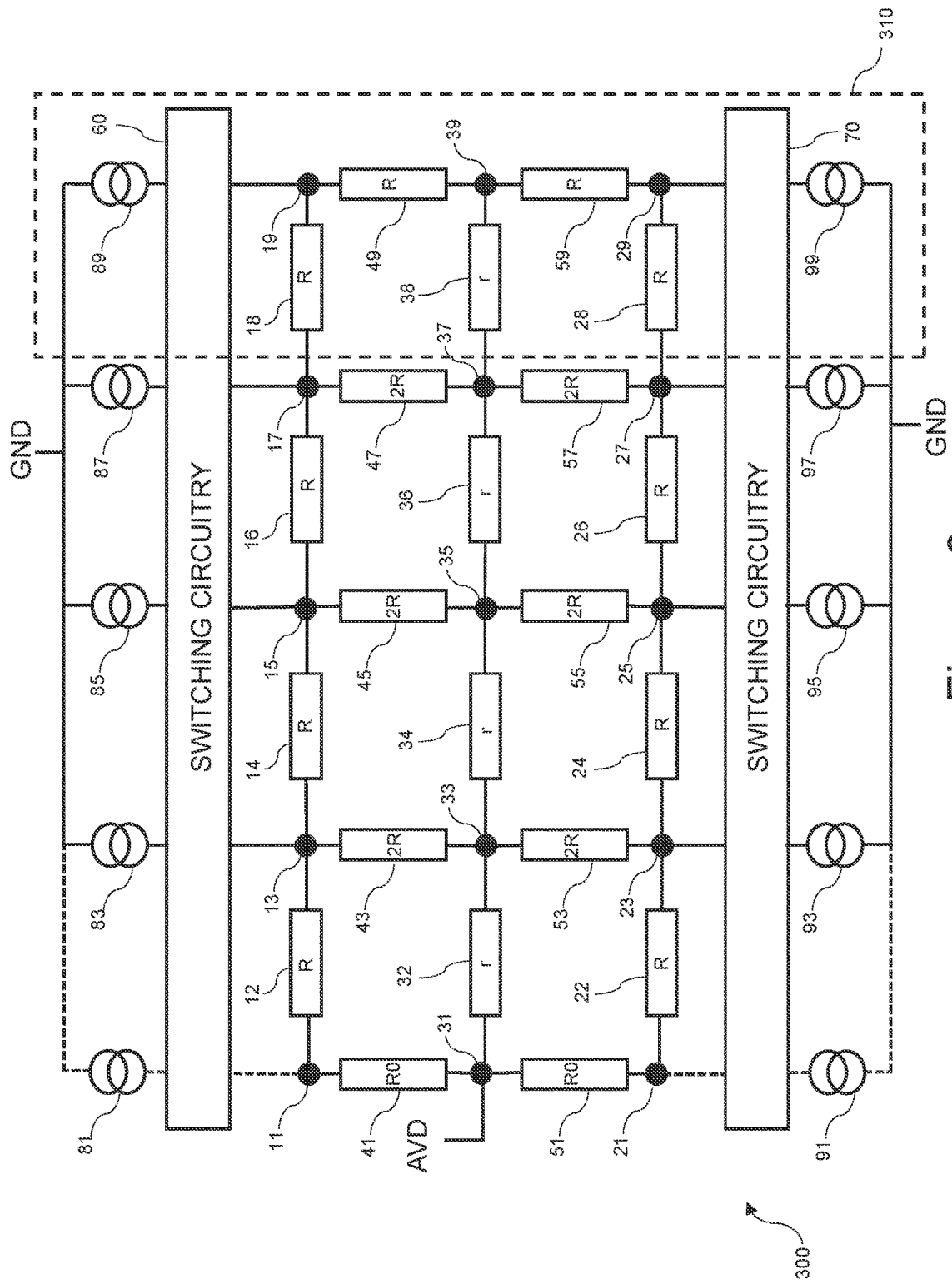
FIG. 3 is a schematic diagram of differential circuitry.

FIG. 3 is a schematic diagram of differential circuitry 300. Differential circuitry 300 may be referred to as DAC circuitry. Differential circuitry 300 comprises a first current path comprising a succession of first and further load nodes 11, 13, 15, 17, and 19, each successive further load node 13, 15, 17, and 19 connected to its preceding load node via a divider impedance 12, 14, 16, and 18. That is, the further load node 13 is connected to its preceding load node (the first load node) 11 via the divider impedance 12, and so on and so forth.

Differential circuitry 300 comprises a second current path similarly comprising a succession of first and further load nodes 21, 23, 25, 27, and 29, each successive further load node 23, 25, 27, and 29 connected to its preceding load node via a divider impedance 22, 24, 26, and 28. That is, the further load node 23 is connected to its preceding load node (the first load node) 21 via the divider impedance 22, and so on and so forth.

The first load nodes 11 and 21 of the first and second current paths comprise (and may be referred to as) a first pair of load nodes. Each successive further load node 13, 15, 17, and 19 of the first current path and its corresponding successive further load node 23, 25, 27, and 29 of the second current path comprise (and may be referred to as) a successive further pair of load nodes. For example, further load nodes 13 and 23 constitute a further pair of load nodes. Similarly, further load nodes 15 and 25 constitute a further pair of load nodes.

The nodes of the first pair of load nodes 11 and 21 are each connected to a first common node 31 via respective first load impedances 41 and 51. Each successive further pair of load nodes 13, 23, 15, 25, 17, 27, 19, and 29 are connected to a successive further common node 33, 35, 37, and 39 via respective further load impedances 43, 53, 45, 55, 47, 57, 49, and 59. That is, the load node 13 of the first current path is connected to the common node 33 via the load impedance 43 and the load node 23 of the second current path is connected to the common node 33 via the load impedance 53, and so on and so forth.

Each further common node 33, 35, 37, and 39 is connected to its preceding common node via a common impedance 32, 34, 36, and 38. That is, the common node 33 is connected to its preceding common node (the first common node) 31 via the common impedance 32, and so on and so forth.

The divider impedances 12, 14, 16, 18, 22, 24, 26, and 28 may be or comprise resistors. The load impedances 41, 51, 43, 53, 45, 55, 47, 57, 49, and 59 may be or comprise resistors. The common impedances 32, 34, 36, and 38 may be or comprise resistors. The common impedances 32, 34, 36, and 38 may have a capacitance component and/or may be referred to as impedances, and/or may be referred to as discrete impedances, but in any case they have a resistance component and may be referred to as resistors.

Differential circuitry 300 further comprises first switching circuitry 60 and a first plurality of current sources 83, 85, 87, and 89, and second switching circuitry 70 and a second plurality of current sources 93, 95, 97, and 99. The first switching circuitry 60 is connected between the further load nodes 13, 11, 17, and 19 of the first current path and the current sources 83, 85, 87, and 89. The second switching circuitry 70 is connected between the further load nodes 23, 21, 27, and 29 of the second current path and the current sources 93, 95, 97, and 99.

The first switching circuitry 60 may be taken to comprise the current sources 83, 85, 87, and 89, or may be considered separate from the current sources. The second switching circuitry 70 may be taken to comprise the current sources 93, 95, 97, and 99, or may be considered separate from the current sources.

The first common node 31 is connected to a voltage reference AVD (or VDD) in line with FIGS. 1 and 2. The first load nodes 11 and 21 are connected respectively to first and second output nodes (not shown). The first load nodes 11 and 21 can be considered to be first and second output nodes, respectively. The current sources 83, 85, 87, 89, 93, 95, 97, and 99 are connected to a voltage reference lower than the voltage reference AVD (e.g. shown as GND) in line with FIGS. 1 and 2, i.e. at the uppermost and lowermost rails in FIG. 3. Of course, the AVD and GND voltage levels will depend on the application, and the circuitry could be implemented "the other way up" i.e. with the values of AVD and GND reversed.

Differential circuitry 300 is configured to output a differential analogue output signal at (between) the output nodes indicative of a differential digital input signal. This is achieved by the first and second switching circuitry 60 and 70 which are configured to change, based on control signals, a magnitude of controllable current signals passing through the load nodes 11, 13, 15, 17, and 19 of the first current path and through the load nodes 21, 23, 25, 27, and 29 of the second current path. The control signals are indicative of the differential digital input signal. The control signals may be controlled/supplied by a controller (not shown).

In particular, although not shown, the first switching circuitry 60 comprises a plurality of switches, each switch connected between a corresponding one of the further load nodes 13, 15, 17, and 19 and a corresponding one of the current sources 83, 85, 87, and 89 (e.g. between load node 13 and current source 83). Furthermore, the second switching circuitry 70 comprises a plurality of switches, each switch connected between a corresponding one of the further load nodes 23, 25, 27, and 29 and a corresponding one of the current sources 93, 95, 97, and 99. The switches correspond to different data bits of the differential digital input signal and the setting of each switch is by the corresponding data bit. In particular, the switches corresponding to a pair of the load nodes may be considered a pair of switches and each pair of switches corresponds to a different data bit of the differential digital input signal. The further pairs of load nodes 13, 23, 15, 25, 17, 27, 19, and 29 may be associated with the corresponding different bits of the differential digital input signal and may be labelled as LSB (least significant bit) 3, LSB2, LSB1, and LSB0, respectively (in line with FIGS. 1 and 2).

Differential circuitry 300 may comprise further connections shown by broken lines and further current sources 81 and 91. The first switching circuitry 60 and the second switching circuitry 70 may comprise a further pair of switches corresponding and connected to the first pair of load nodes 11 and 21, and to the current sources 81 and 91. This further pair of switches (and also the first pair of load nodes 11 and 21) may correspond to a bit of the differential digital input signal, for example the most significant bit (MSB). Of course, the number of bits implemented at each pair of load nodes, and indeed the number of pairs of load nodes provided, will differ from implementation to implementation, and the arrangement in FIG. 3 is simply an example.

Figure 4:
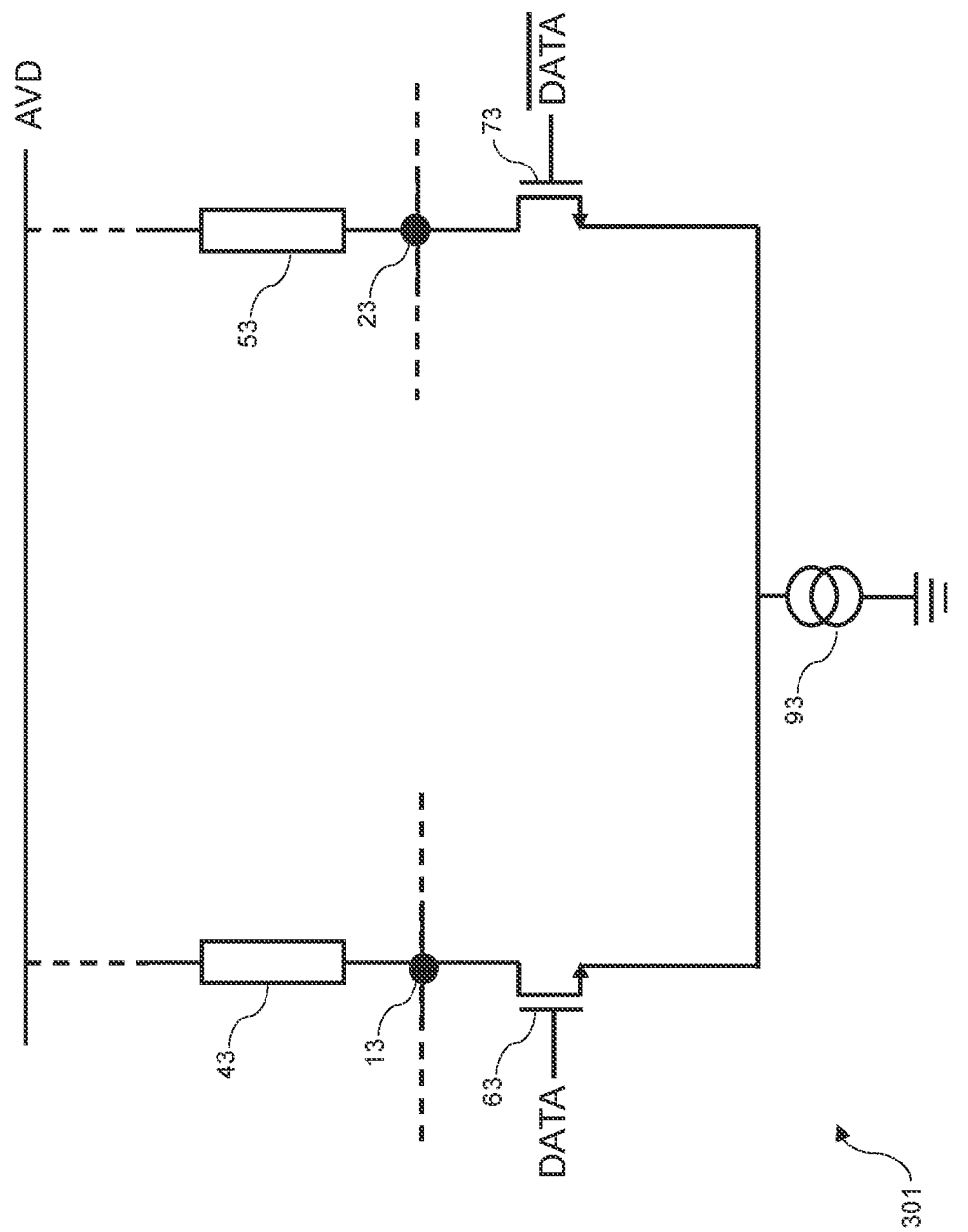
FIG. 4 is a schematic diagram of switching circuitry.

FIG. 4 is a schematic diagram of switching circuitry 301. Switching circuitry 301 illustrates an example of a part of the first switching circuitry 60 and the second switching circuitry 70. Switching circuitry 301 comprises one of the pairs of switches, in particular a first switch 63 connected between the load node 13 (at its drain terminal) and the current source 93 (at its source terminal), and a second switch 73 connected between the load node 23 (at its drain terminal) and the current source 93 (at its source terminal). The first switch 63 belongs to the first switching circuitry 60 and the second switch 73 belongs to the second switching circuitry 70.

Switching circuitry 301 as illustrated further comprises the load impedances 43 and 45. The further connections of the load impedance 43 and 53 and of the load nodes 13 and 23 are not illustrated for simplicity of illustration and instead broken lines are used. However it will be appreciated how the switching circuitry 301 is a part of the differential circuitry 300 by referring to FIG. 3 of the differential circuitry 300.

The first and second switches 63 and 73 are connected to the same current source 93 in FIG. 4. FIG. 3 shows the first switching circuitry 60 connected to a different current source to the second switching circuitry 70. For each pair of switches in the first and second switching circuitry 60 and 70, the switches may share the same current source (as shown in FIG. 4) or may use different current sources (as shown in FIG. 3).

As mentioned above with reference to FIG. 3, each pair of switches corresponds to a data bit of the differential digital input signal. As illustrated in FIG. 4, the first switch 63 is controlled by a control signal (at its gate terminal) labelled DATA and the second switch 73 is controlled by a complementary control signal (at its gate terminal) labelled/DATA. The control signals DATA and/DATA may be considered to represent a bit of the differential digital input signal. When DATA is high (or logic 1)/DATA is low (or logic 0) and vice versa.

The other pairs of switches in differential circuitry 300 illustrated in FIG. 3 may have the same or similar structures and connections as those shown in FIG. 4.

Returning to FIG. 3, for each pair of switches, as one switch is turned on and current is thus contributed to the corresponding current path the other switch is turned off. Therefore the current flowing from a given pair of current sources is fixed assuming the pair of current sources concerned have the same current magnitude as one another or assuming that the pair of current sources concerned is implemented as a single shared current source in line with FIG. 4. Each pair of switches may be considered to belong to a "slice" of the differential circuitry 300. Each such slice may be taken to comprise the pair of switches, and a pair of current sources (or a single shared current source in line with FIG. 4) connected to those switches. It may therefore be considered that the current flowing from the supply (controlled by the pair of current sources considered together, or by the single shared current source in line with FIG. 4) to the slice is fixed for each slice.

In a running example (in line with that mentioned earlier), the common impedances 32, 34, 36, and 38 each have a resistance value of r, the divider impedances 12, 22, 14, 24, 16, 26, 18, and 28 each have a resistance value of R, the load impedances 41 and 51 each have a resistance value of R0, the load impedances 43, 53, 45, 55, 47 and 57 each have a resistance value of 2R, and the load impedances 49 and 59 each have a resistance value of R. Of course, in other implementations the R2R binary weighting scheme need not be employed and the impedances may adopt other resistance values.

Considering an example implementation of the differential circuitry 300 with the elements within the dashed box 310 not provided (i.e. in particular configured as a 6-bit DAC), the current caused to flow through output node 21 by the corresponding current source is 7I, where I is the current caused to flow through each of the load nodes 23, 25, and 27 by the respective corresponding current sources. The same considerations apply to the "other side" of the differential circuitry 300, i.e. for the output node 11 and the load nodes 13, 15, and 17. In such an implementation (with the elements within the dashed box 310 not provided), the load impedances 47 and 57 each have a resistance value of R (and not 2R). In such an implementation the following values for R, R0 and r lead to improved performance: R=150 Ohms, R0=60 Ohms, and r=(50/3) Ohms≈17 Ohms.

The differential circuitry 300 achieves a number of advantages.

The common impedances 32, 34, 36, and 38 provide fixed DC voltage drops across the successive further common nodes 33, 35, 37, and 39 (i.e. from one to the next) which do not change with the differential digital input signal. This in turn will lower the maximum voltages at the successive further load nodes 13, 15, 17, and 19 and the successive further load nodes 23, 25, 27, and 29, with those maximum voltages being lower from one successive further load node to the next. This therefore solves or at least partly addresses the overvoltage problem described above with reference to FIGS. 2 and 3 (i.e. the components (switches) are better protected). For example, the maximum voltages at the load nodes 19 and 29 will be lower given the presence of the common impedances 32, 34, 36, and 38 than they would be without the presence of the common impedances 32, 34, 36, and 38, thereby offering some overvoltage protection to the switches (corresponding to switches 63/73 in FIG. 4) connected to those nodes.

This fixed DC voltage drop compensates for the variation in the DC levels (common mode voltage) across the network of impedances (including the common, load, and divider impedances) which otherwise affects the current contribution from each slice and degrades performance (as explained below in relation to FIG. 9).

Incidentally, the voltage drop produced by the common impedances 32, 34, 36, and 38 will change the current contribution from each slice, but since the voltage drops mentioned above are DC voltage drops the change in current contribution from each slice will be a DC change and will not affect the differential analogue output signal (current).

In summary, the differential circuitry 300 addresses the overvoltage problem described with reference to FIGS. 2 and 3, improves performance compared to the DAC circuitry 100 and 200 illustrated in FIGS. 2 and 3, and functions with appropriate weightings between each slice (i.e. analogously to an R2R ladder/network) so as to be suitable for incorporation into or operation as a DAC.

The graphs in FIGS. 5 to 9 will now be described. These graphs were obtained by simulating a simpler form of the differential circuitry 300, in particular configured as a 6-bit DAC and with the elements within the dashed box 310 not provided. In such an implementation and in line with the running example, the load impedances 47 and 57 each have a resistance value of R (and not 2R). Thus, in the implementation as simulated, the load nodes 17, 27 correspond to LSB0, the load nodes 15, 25 correspond to LSB1, the load nodes 13, 23 correspond to LSB2 and the load nodes 11, 21 correspond to a combination of the top 3 MSB bits (e.g. with the current sources 81/91 and associated switches of the switching circuitry 60, 70 representative of 7 MSB slices controlled by thermometer decoded signals).

Furthermore, in the simulation (unless stated otherwise) a data signal D0 for the switches of LSB0 (at load nodes 17, 27) was toggled at 1 GHz, a data signal D1 for the switches of LSB1 (at load nodes 15, 25) was toggled at 0.5 GHz and a data signal D2 for the switches of LSB2 (at load nodes 11, 21) was toggled at 0.25 GHz, and data signals for the upper 3 MSB bits were kept static.

It is also assumed that the common impedances 32, 34, 36, and 38 have a value r.

Figure 5:
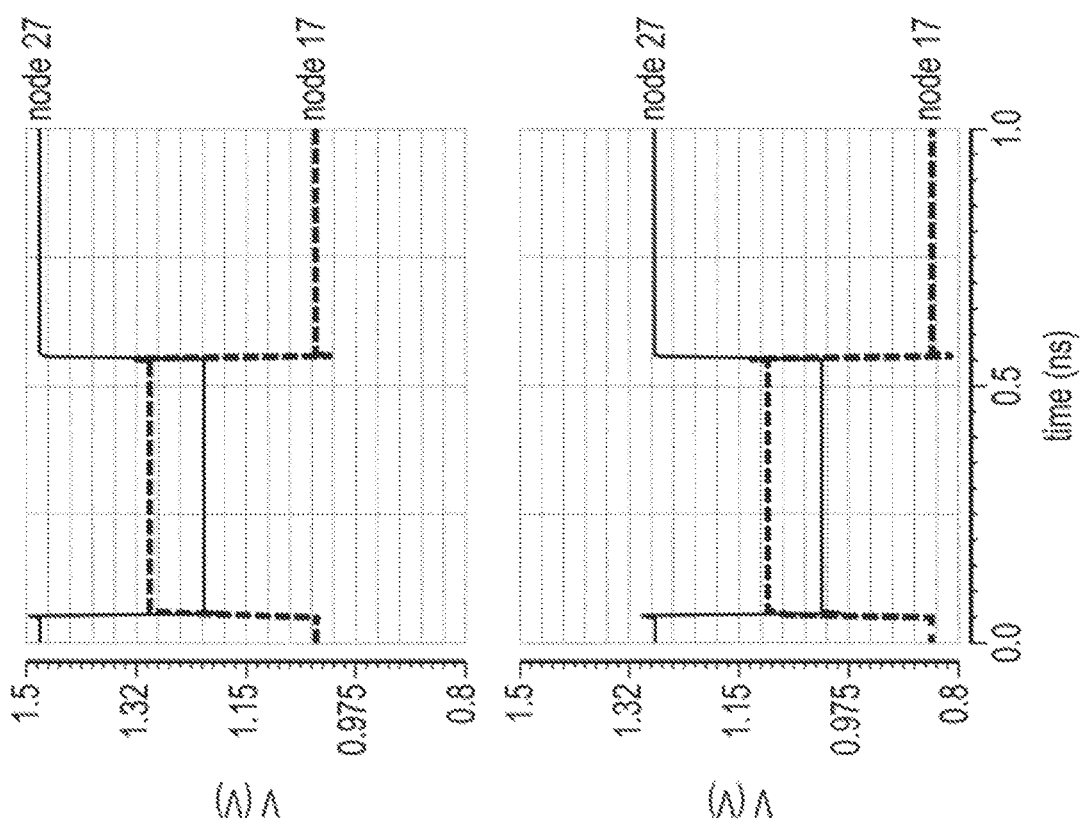
FIG. 5 is a graph useful for understanding FIG. 3.

FIG. 5 is a graph useful for understanding the differential circuitry 300 (in its simpler form), and focusses on LSB0. The broken lines in each plot show, over time, the voltage at the load node 17 and the solid lines show, over time, the voltage at the load node 27. The top plot shows the voltages when r=0 Ohms and the bottom plot shows the voltages when r=50 Ohms. For simplicity, these graphs were obtained by keeping the values of the D1 and D2 (and the MSB data signals) fixed and only toggling the values of the D0 signals (i.e. D0 and/D0, looking at FIG. 4).

It will be appreciated from FIG. 5 that the voltage is at a lower level at both of the load nodes 19 and 29 when the common impedances are included in the circuitry (i.e. when r=50 Ohms) compared to when they are not (i.e. when r=0 Ohms).

Figure 6:
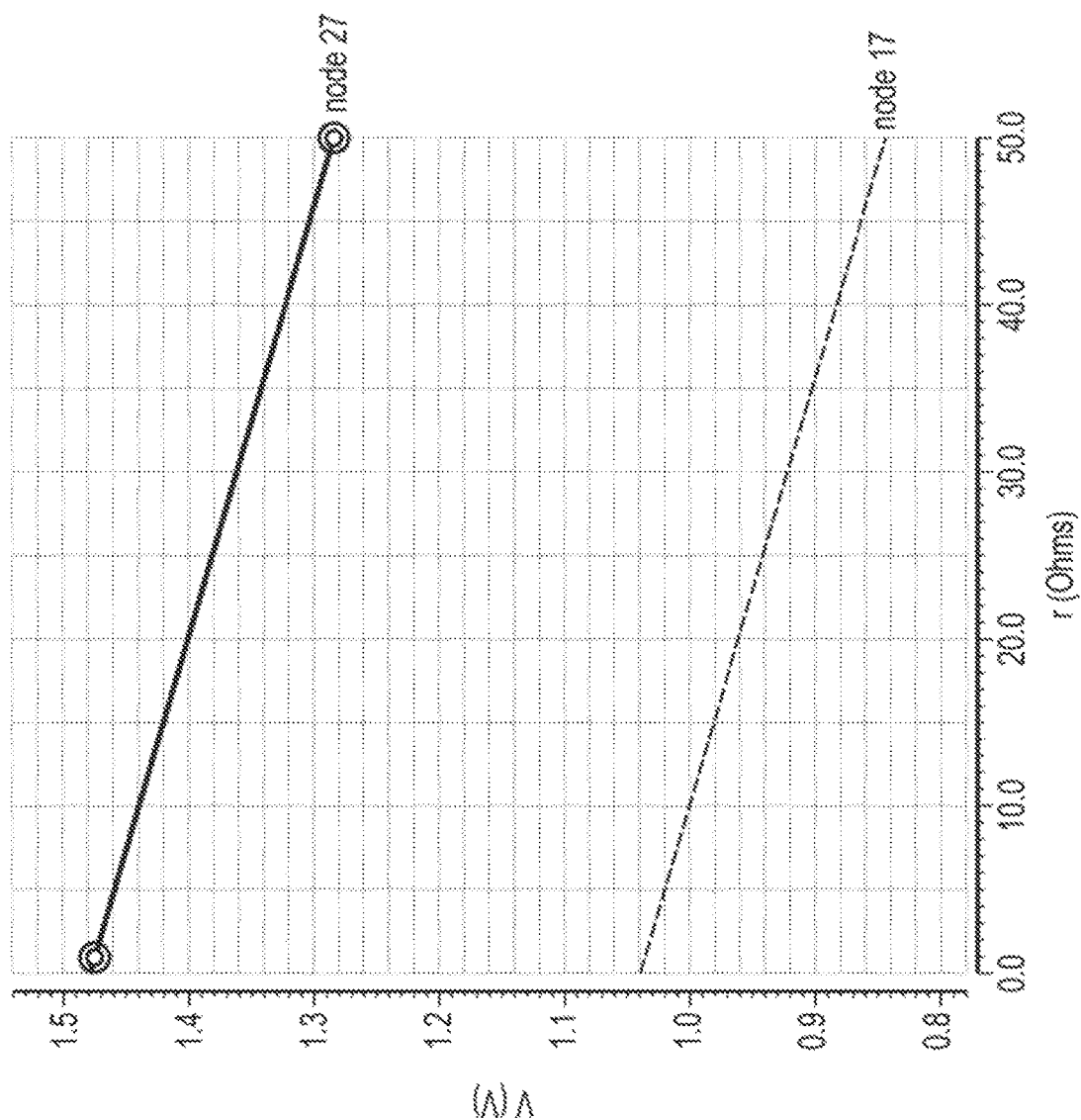
FIG. 6 is a graph useful for understanding FIG. 3.

FIG. 6 is a graph useful for understanding the differential circuitry 300 (in its simpler form), and like FIG. 5 focusses on LSB0. The simulation settings (e.g. the data signals) were the same as for FIG. 5. The broken line shows how the DC voltage level at the load node 17 changes as the value of r changes and the solid line shows how the DC voltage level at the load node 27 changes also as the value of r changes. It will be appreciated that increasing the value of r reduces the DC voltage at the load nodes 17 and 27. The maximum voltage (at the load node 27) is 1.474 V with r=0 Ohms (i.e. without the common impedances) and is 1.283 V with r=50 Ohms. The values for the load node 17 are lower than those for the load node 27 because the circuitry 300 is differential and in the case of this graph, the switch corresponding to the load node 17 is off whilst the switch corresponding to the load node 27 is on.

Figure 7:
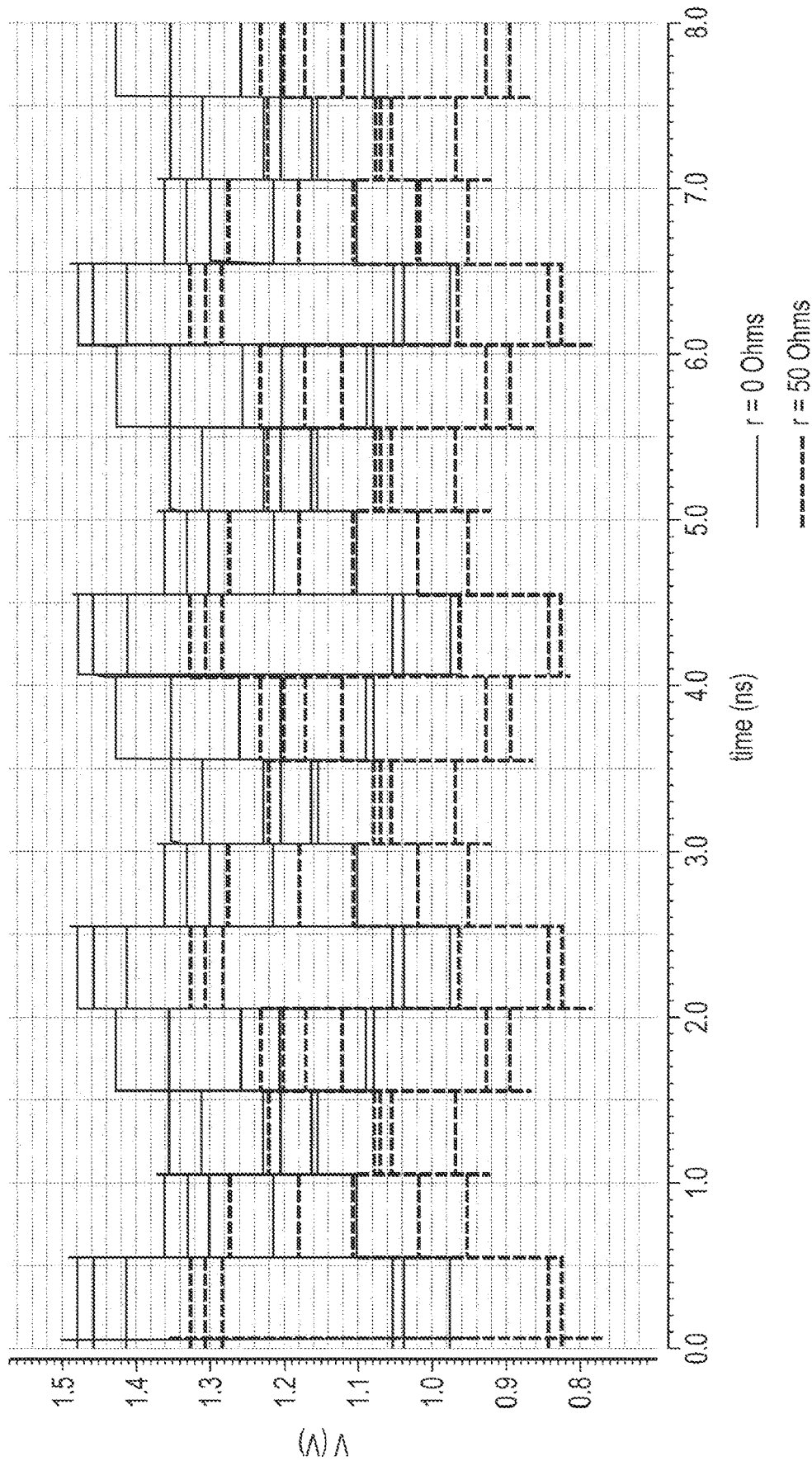
FIG. 7 is a graph useful for understanding FIG. 3.

FIG. 7 is a graph useful for understanding the differential circuitry 300 (in its simpler form), and focusses on the LSBs (i.e. LSB0 to LSB2). The solid lines show the voltages at the load nodes 17, 27, 15, 25, 13, and 23 when r=0 Ohms (i.e. when there are no common impedances) and the broken lines show the voltages at the same load nodes when r=50 Ohms. This graph was obtained by toggling the values of D0, D1 and D2. It will be appreciated that the voltages are lower when r=50 Ohms compared to when r=0 Ohms and therefore the common impedances reduce the voltages at the load nodes. The maximum value of the voltage when r=0 Ohms is 1.48 V, and when r=50 Ohms it is 1.32 V.

Figure 8:
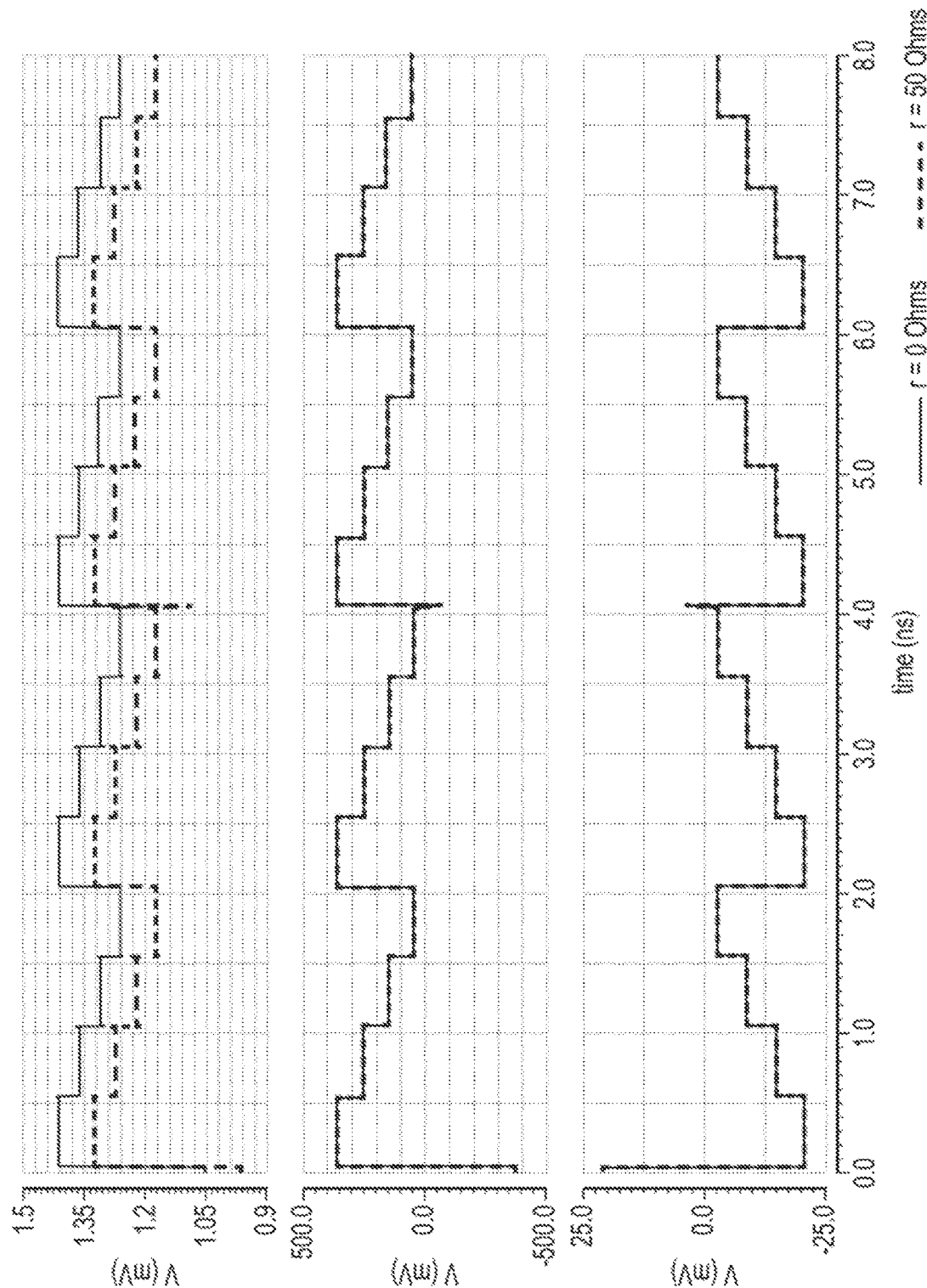
FIG. 8 is a graph useful for understanding FIG. 3.

FIG. 8 is another graph useful for understanding the differential circuitry 300 (in its simpler form).

In the top plot the solid line shows the voltage at the load node 13 when r=0 Ohms and the broken line shows the voltage at the load node 13 when r=50 Ohms. It will be appreciated that the voltage is lower when r=50 Ohms compared to when r=0 Ohms.

In the middle plot, the solid line shows the differential voltage signal between the load nodes 13 and 23 when r=0 Ohms and the broken line shows the same differential voltage signal when r=50 Ohms. It will be appreciated that the differential voltage signal between the load nodes 13 and 23 is not affected by the change in value of r.

In the bottom plot, the solid line shows the overall differential voltage output of the differential circuitry 300 (i.e. between the output nodes, effectively between nodes 11 and 21) when r=0 Ohms and the broken line shows the same overall differential voltage output when r=50 Ohms. It will be appreciated, as for the middle plot, that the inclusion of the common impedances (i.e. r being non-zero or non-negligible, such as greater than 5 or 10 or 15 or 20 or 25 or 30 or 40 or 50 or 100 Ohms, depending on the application) does not affect the overall differential output voltage, as the solid and broken lines move together. The bottom plot appears "upside down" compared to the middle plot only because the differential output voltage in the bottom plot was calculated by calculating the difference between the two "sides" of differential circuitry 300 the other way round compared to the middle plot.

Figure 9:
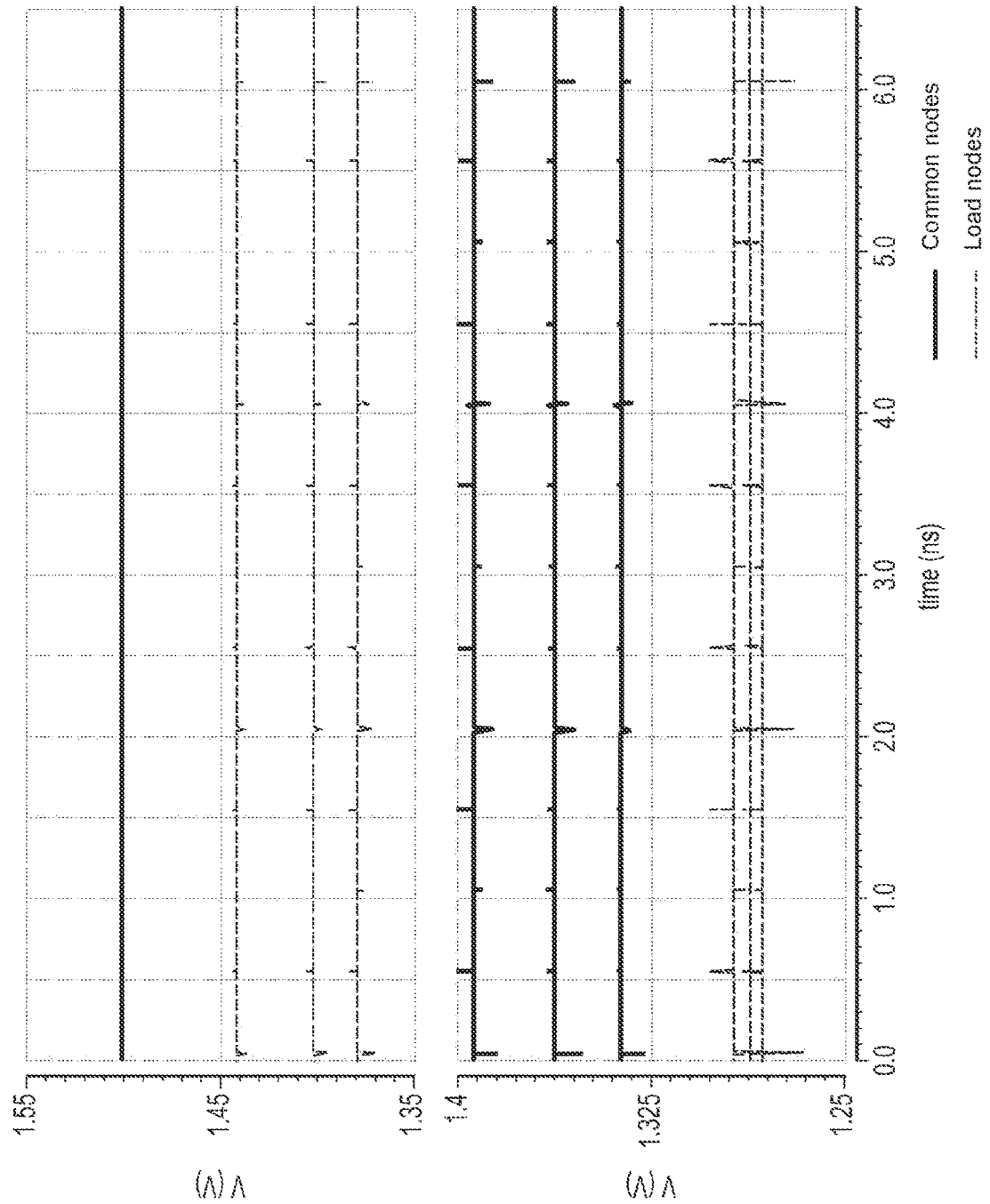
FIG. 9 is a diagram useful for understanding FIG. 3.

FIG. 9 is another graph useful for understanding the differential circuitry 300 (in its simpler form). The solid lines show the DC levels (or common mode voltages) at the common nodes 33, 35, and 37 and the broken lines show the DC levels (or common mode voltages) at the load nodes 13, 23, 15, 25, 17, and 27. The top plot shows the DC levels when r=0 and the bottom plot shows the DC levels when r=20 Ohms.

Looking at the solid lines, the DC level is the same at the common nodes 33, 35, and 37 when r=0 in the top plot (there are three traces but they are all the same so on top of each other). In the bottom plot, when r=20 Ohms, the DC levels at the common nodes 33, 35, and 37 shown by the solid lines are different from each other and are each lower than their values when r=0.

Looking at the broken lines, the DC levels at the load nodes 13, 23, 15, 25, 17, and 27 are lower when r=20 Ohms (bottom plot) compared to when r=0 (top plot), and are closer to each other (almost equal) when r=20 Ohms compared to when r=0. There are six traces in each plot for the load nodes 13, 23, 15, 25, 17, and 27 (broken lines) but the pairs of corresponding load nodes of the same slice (i.e. 13 and 23, 15 and 25, and 17 and 27) have the same DC levels so that only three traces are visible.

The DC levels at the load nodes 13, 23, 15, 25, 17, and 27 being closer together is advantageous because this means that the headroom for the current sources is closer together (and almost equal) across the different slices. This means that the current caused to flow in each slice by the current sources is closer to being equal than in the case when r=0 (because in that case the DC levels of the load nodes will be further apart from each other). The more equal currents above results in better performance.

The DC levels discussed above may be considered to be common mode voltages given that the differential circuitry 300 is differential.

The values used above for R and r are of course exemplary and there are many appropriate values that may be used. Furthermore, the values of for R and r may be different depending on the specific implementation of the differential circuitry 300, e.g., the maximum allowed voltage, the magnitude of the current signals flowing in the differential circuitry, etc. Furthermore, the impedances may have different values of impedance/resistance than shown.

The differential circuitry 300 may comprise more or fewer slices than as described above and shown in FIG. 3. For example, the differential circuitry 300 may comprise just the slices corresponding to the common nodes 31 and 33.

Figure 10:
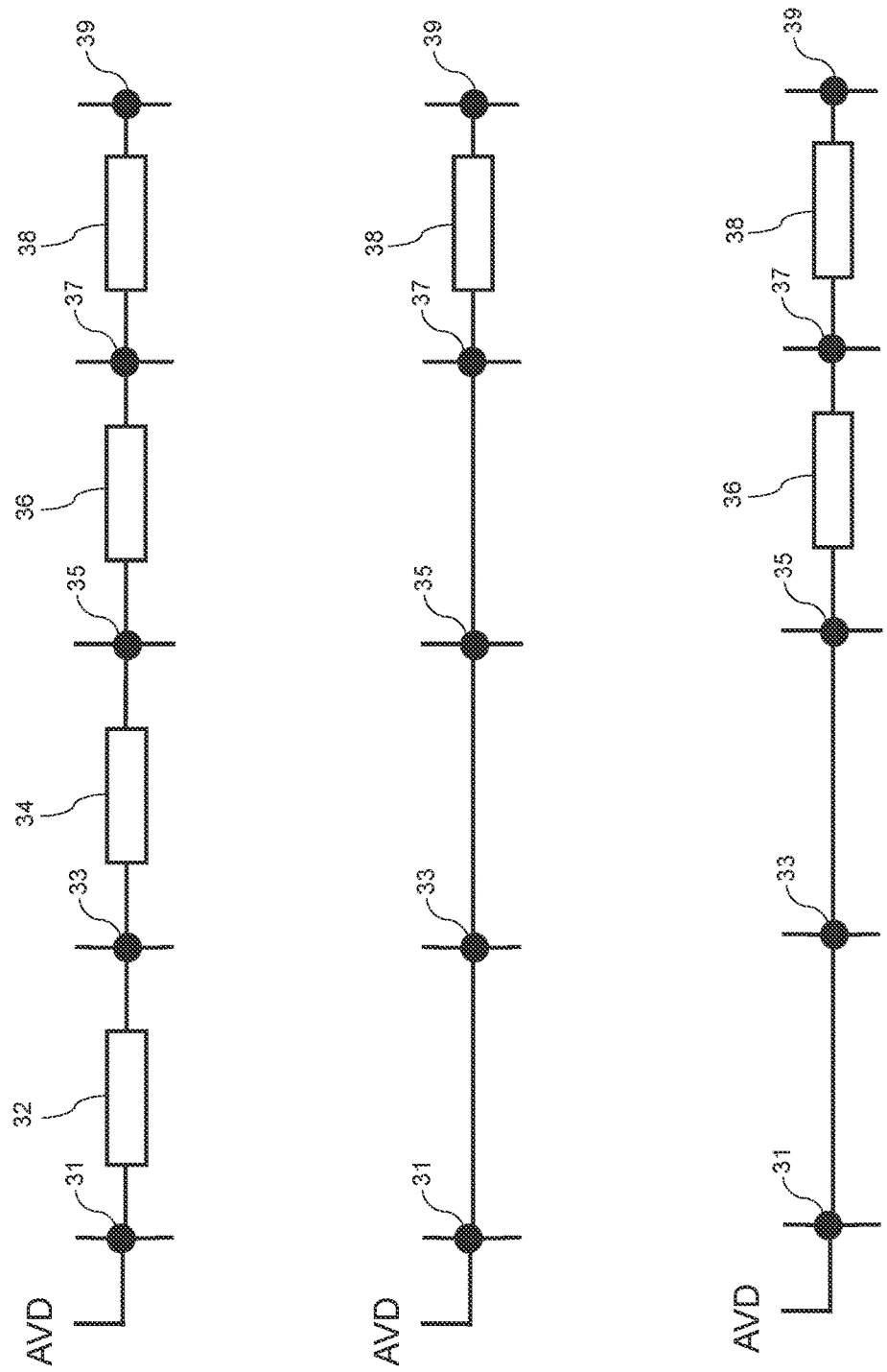
FIG. 10 is a diagram useful for understanding variations of FIG. 3.

Alternatively or additionally, the differential circuitry 300 may comprise fewer of the common impedances 32, 34, 36, and 38 than as described in the examples above. In this regard, FIG. 10 is a schematic diagram showing three possible variations of a portion of the differential circuitry 300 of FIG. 3. The upper variation corresponds to FIG. 3 itself, and all of the common impedances 32, 34, 36, and 38 are provided.

However, the differential circuitry 300 may comprise only one of the common impedances 32, 34, 36, and 38 or any number of the common impedances, for example only common impedance 38 as in the middle variation, or only a plurality of the common impedances such as 36 and 38 as in the lower variation. These are simply examples and other variations are of course possible looking at FIG. 10. That is, only one (or each of any number) of the further common nodes 33, 35, 37, and 39 may be connected to its preceding common node via a common impedance 32, 34, 36, and 38 and the or each other further common node may be shorted or short-circuited to its preceding common node (i.e. a connection that is not via a resistor, or any other component). It may be said that the or each other further common node may be directly connected to its preceding common node, with "directly connected" meaning not connected via a resistor or a discrete impedance (or any other discrete component), or connected via a substantially zero resistance connection or a low or negligible impedance/resistance connection. That is, the common impedances 32, 34, 36, and 38 are resistors in the running example (and may be referred to as discrete impedances, but having a resistance component) and are different from unavoidable (negligible) impedance in a circuit, e.g. of a wire connecting two components.

Each of the common impedances 32, 34, 36, and 38, the load impedances 41, 51, 43, 53, 45, 55, 47, 57, 49, and 59, and the divider impedances 12, 22, 14, 24, 16, 26, 18, and 28 may be a discrete impedance, or a resistor, or a discrete resistor/resistance (bearing in mind that the common impedances 32, 34, 36, and 38 are or comprise resistors). These impedances are different from unavoidable impedance in a circuit, e.g. of a wire connecting two components. Any of these resistors may be implemented as polysilicon resistors, and/or as a discrete resistor or a distributed resistor.

The switches of the first and second switching circuitry 60 and 70 (e.g. the switches 63 and 73) may be transistors, in particular FET transistors. For example, they may be MOSFET transistors.

The slices of differential circuitry 300 described above may correspond to any bit or bits of a differential digital input signal and not only the bits as described above.

Figure 11:
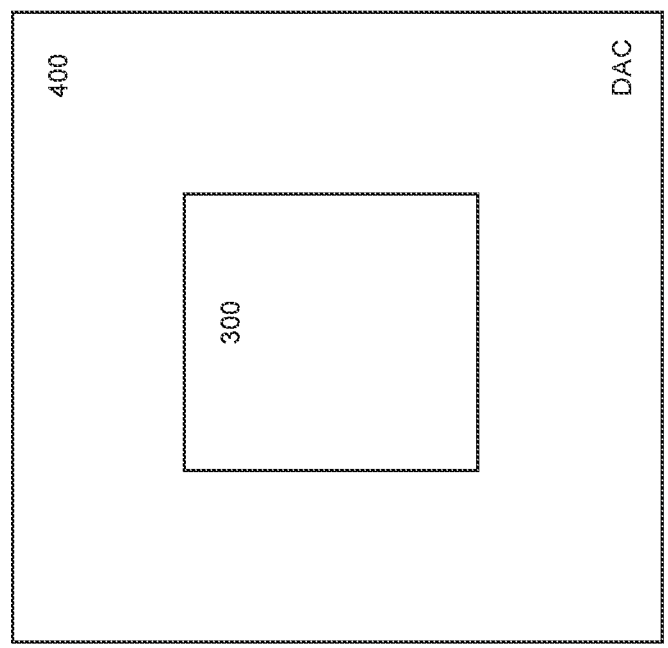
FIG. 11 is a schematic diagram of a DAC.

FIG. 11 is a schematic diagram of a DAC 400 comprising the differential circuitry 300. As mentioned above, the slices of the differential circuitry 300 may correspond to bits of a differential digital input signal and the switches in differential circuitry 300 change, based on the bits of the differential digital input signal, a magnitude of the controllable current signals passing through the load nodes of differential circuitry 300 to ultimately output a differential analogue output signal between the first and second output nodes.

Figure 12:
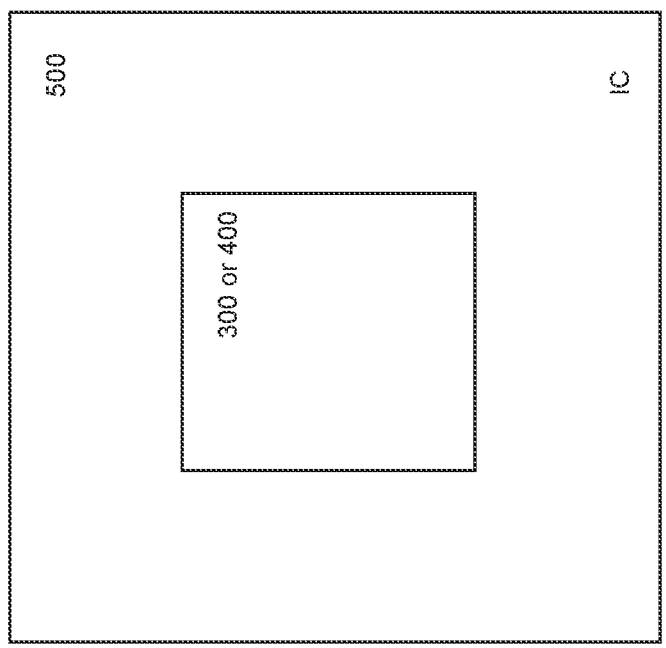
FIG. 12 is a schematic diagram of integrated circuitry.

FIG. 12 is a schematic diagram illustrating an integrated circuit (IC) 500 comprising the differential circuitry 300 or the DAC 400.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

In any of the above aspects, various features may be implemented in hardware, or as software modules running on one or more processors/computers. The invention also provides a computer program or a computer program product comprising instructions which, when executed by a computer, cause the computer to carry out (as a method) any functionality described herein, and a non-transitory computer-readable medium comprising instructions which, when executed by a computer, cause the computer to carry out any of the functionality described herein. A computer program embodying the invention may be stored on a non-transitory computer-readable medium, or it could, for example, be in the form of a signal such as a downloadable data signal provided from an Internet website, or it could be in any other form.

The invention claimed is:

1. Differential circuitry comprising:
   first and second current paths each comprising a succession of first and further load nodes, each successive further load node connected to its preceding load node via a divider impedance; and
   first switching circuitry connected to the further load node or nodes of the first current path, and second switching circuitry connected to the further load node or nodes of the second current path, the first and second switching circuitry configured to control a magnitude of controllable current signals passing through the load nodes of the first current path and the second current path, respectively, wherein:

the first load nodes of the first and second current paths comprise a first pair of load nodes, and the or each successive further load node of the first current path and its corresponding successive further load node of the second current path comprise a successive further pair of load nodes;

the first pair of load nodes are connected to a first common node via respective first load impedances and the or each successive further pair of load nodes are connected to a successive further common node via respective further load impedances;

the or each successive further common node is connected to its preceding common node; and the or at least one of the successive further common nodes is connected to its preceding common node via a resistor.

2. The differential circuitry as claimed in claim 1, wherein the or each other successive further common node is shorted to its preceding common node.

3. The differential circuitry as claimed in claim 1, comprising N said successive further load nodes and N said successive further common nodes, wherein N is an integer greater than 1, wherein:

for n of the successive further common node or nodes, the or each successive further common node is connected to its preceding common node via a resistor, wherein n is an integer and at least 1; and for N-n of the successive further common node or nodes, the or each successive further common node is shorted to its preceding common node.

4. The differential circuitry as claimed in claim 3, wherein:

n is 1 or N; or n is 1≤n≤N.

5. The differential circuitry as claimed in claim 1, wherein each successive further common node is connected to its preceding common node via a resistor.

6. The differential circuitry as claimed in claim 1, wherein the resistors interconnecting said common nodes have the same resistance values as each other.

7. The differential circuitry as claimed in claim 1, wherein the first load nodes are connected to first and second output nodes, respectively.

8. The differential circuitry as claimed in claim 7, wherein the differential circuitry is configured to output a differential output signal between the first and second output nodes indicative of a differential input signal.

9. The differential circuitry as claimed in claim 8, wherein the first switching circuitry and the second switching circuitry are configured to change the magnitude of the controllable current signals based on control signals indicative of the differential input signal.

10. The differential circuitry as claimed in claim 1, wherein the first switching circuitry comprises a plurality of switches connected to the load nodes of the first current path, respectively, and wherein the second switching circuitry comprises a plurality of switches connected to the load nodes of the second current path, respectively.

11. The differential circuitry as claimed in claim 1, wherein the first switching circuitry comprises a plurality of current sources connected to define respective currents at the switches of the first switching circuitry, respectively, and wherein the second switching circuitry comprises a plurality of current sources connected to define respective currents at the switches of the second switching circuitry, respectively.

12. The differential circuitry as claimed in claim 1, wherein the first switching circuitry and the second switching circuitry comprise a plurality of current sources, each current source connected to define respective currents at the switches connected to a said pair of load nodes.

13. The differential circuitry as claimed in claim 1, wherein the switches of the first switching circuitry are configured to be controlled by control signals indicative of a first input signal, and wherein the switches of the second switching circuitry are configured to be controlled by control signals indicative of a second input signal, the first and second input signals together corresponding to a differential input signal.

14. Digital-to-analogue converter, DAC, circuitry comprising the differential circuitry as claimed in claim 1.

15. Integrated circuitry such as an IC chip, comprising the DAC circuitry as claimed in claim 14.

16. Integrated circuitry such as an IC chip, comprising the differential circuitry as claimed in claim 1.

* * * * *